(12) United States Patent
Kirkelund et al.

(10) Patent No.: US 7,936,175 B2
(45) Date of Patent: May 3, 2011

(54) FULL FUNCTION TEST FOR IN SITU TEST OF SENSORS AND AMPLIFIERS

(75) Inventors: Morten Kirkelund, Søborg (DK); Lars Munch Kofoed, Bagsværd (DK)

(73) Assignee: Brüel & Kjaer Sound & Vibration Measurement A/S, Naerum (DK)

( * ) Notice: Subject to any disclaimer, the term of this patent is extended or adjusted under 35 U.S.C. 154(b) by 464 days.

(21) Appl. No.: 12/119,731

(22) Filed: May 13, 2008

(65) Prior Publication Data
US 2009/0284263 A1 Nov. 19, 2009

(51) Int. Cl.
*G01R 29/22* (2006.01)
*G01P 21/00* (2006.01)

(52) U.S. Cl. ......................................... 324/727; 73/1.38
(58) Field of Classification Search .................. 324/523, 324/727; 73/1.37, 1.38
See application file for complete search history.

(56) References Cited

U.S. PATENT DOCUMENTS

| | | | |
|---|---|---|---|
| 3,786,348 A * | 1/1974 | Lynas et al. ................... 324/727 |
| 4,620,446 A | 11/1986 | Jensen et al. |
| 5,375,468 A * | 12/1994 | Ohta et al. .................. 73/514.29 |
| 5,400,297 A | 3/1995 | Frederiksen |
| 5,447,051 A * | 9/1995 | Hanks et al. .................... 73/1.15 |
| 5,753,793 A | 5/1998 | Lindahl et al. |
| 6,111,717 A * | 8/2000 | Cloke et al. ..................... 360/67 |
| 6,215,302 B1 * | 4/2001 | Carey ............................ 324/252 |
| 6,698,269 B2 | 3/2004 | Baber et al. |
| 7,042,228 B2 * | 5/2006 | Lally et al. .................... 324/527 |
| 7,162,911 B2 * | 1/2007 | Hattori ........................... 73/1.38 |
| 7,358,744 B2 * | 4/2008 | Scholz .......................... 324/522 |

* cited by examiner

*Primary Examiner* — Jeff Natalini
(74) *Attorney, Agent, or Firm* — Stites & Harbison PLLC; Douglas E. Jackson

(57) ABSTRACT

The present invention provides a method and an apparatus for in situ test of transducers comprising sensing elements and associated conditioning preamplifiers. The invention makes it possible to evaluate the characteristics of the complete transducer by means of higher integration of the transducer circuitry. Tests can be performed from a remote central location without additional wiring and while the transducer is in operating environment. Testing is performed by superposing test signals and test sequence control signals on the wiring for the transducer output signal, hereby offering flexibility without sacrificing simplicity. Test signalling is by additional circuitry in the transducer interpreted and routed to the input of the conditioning preamplifier based on signalling from the remote test generator, and the signals engendered from the test signals can be analyzed from a remote analyzing system for complete qualifications of the transducer under test.

9 Claims, 4 Drawing Sheets

FULL FUNCTION TEST FOR IN SITU TEST OF SENSORS AND AMPLIFIERS

FIELD OF THE INVENTION

The present invention relates to apparatus and methods for in situ test of sensors and related amplifiers and in particular for test of reactive sensors and amplifiers for said sensors, a sensor and an amplifier constituting a transducer.

BACKGROUND OF THE INVENTION

Sensors and transducers are widely used in systems for data acquisition where physical properties are subject to be measured, gathered or analyzed. Measurements and gatherings of properties can be used for immediate use or for statistical purpose and analysis and can even further be used for monitoring or evaluation purposes.

In order to be able to make use of sensed signals, some kind of conditioning of the signal itself might be applicable. A sensor is hereby understood to be the sensing element and a transducer is often referred to as the sensing element together with means for conditioning and transmitting the sensed signal in a usable manner like a preamplifier circuit, and in the present context this is the meaning of the term transducer.

Sensors in this kind of areas can be based on several different elements and principles such as piezo-electric, piezo-resistive, capacitive or magneto restrictive.

For use in instrumentation and other areas, it is often of outmost importance that systems comprising sensors, transducers and related equipment can be field-tested in order to be highly reliable for gathering of trustworthy information. Several attempts have been made to accomplish this.

In WO 95/06259 and U.S. Pat. No. 5,753,793 there is disclosed a system where a piezo-electric transducer is exited from a generator and the resulting ringing of the transducer is analyzed. This straightforward approach can work for systems where the sensing device can be put in an oscillating state, but characterisation of the transducer system is not complete and the control systems necessary for the application need to be installed separately.

In WO 86/04137 there is disclosed a system comprising a primary and a secondary transducer which are built together. The secondary piezo-electric transducer can be energized by an introduced electrical signal and generates hereby a mechanical excitation to be picked up by the primary piezo-electric transducer. The difference signal is the signal measured and in case of no signal or faulty signal, the transducer is susceptible. This system will need considerably more special hardware and twice the cabling of a conventional circuit.

U.S. Pat. No. 6,698,269 discloses a system for test of transducers by means of a built-in test signal generator connected to the sensor-amplifier connection point for test and disconnecting the amplifier for analysis of the transducer. This system is based on the idea of exiting the sensor element by means of a generator generating a suitable electrical signal. The preamplifier in situ is not under test, and implementation and control of the system is an issue that remains to be solved.

U.S. Pat. No. 5,400,297 discloses a method and a system for injection of a test signal through a relatively small capacitor into the junction point of the inlet of a preamplifier for acoustic devices and a sensor. The system, which primarily is designed for capacitive voltage sensors, though adaptable for charge type sensors, requires a separate connection point with very high quality cabling in addition to the normal signal cabling.

DISCLOSURE OF THE INVENTION

On this background it is the object of the present invention to provide an apparatus and a method for testing and characterising complete sensor-, transducer- and amplifier systems, which apparatus and method solve the problems and issues of prior art, and at the same time offer a hitherto unseen detailed characterisation of the sensor and associated circuits without the associated extra accessories, cabling and equipment of prior art. The invention provides apparatus and methods for remote test of transducer arrays from a central control unit. The present invention is far more simple and universal in use due to much higher integration of the transducer itself. The principle in general of the present invention relies on test of the impedance of the sensing element in a transducer by means of the amplifier circuitry for the sensing elements conditioning. It is possible to analyze the electrical characteristics of a sensor and conditioning preamplifier, where the sensor is either part of the feedback circuit or otherwise connected in a gain dependent manner, by injecting a suitable test signal into the sensor-conditioning preamplifier. The injection takes place by modulation of the current on the output terminal of a transducer by a current originating from an external control source and from an external test generator. Current modulation on the transducer output terminal by the external control source is picked up and decoded in a mode control circuit built into the transducer. Current modulating on the transducer output terminal by the external test signal is reflected in a circuit capable of measuring a current as a voltage in the preamplifier and where the residual current originating from the test signalling is derived. The mode control controls a switch which determines whether or not the test signal is routed to the input of the preamplifier for test of the complete transducer and associated circuitry. Examples of applicable sensors can be but are not limited to capacitive, magneto-restrictive, inductive and piezo-electric sensors and preamplifiers of two-wire or three or more wire types in charge or voltage input mode. A structure in schematic form and some representative embodiments will be described in detail in the following.

DETAILED DESCRIPTION OF SOME CHARACTERISTIC EMBODIMENTS

Figure 1:
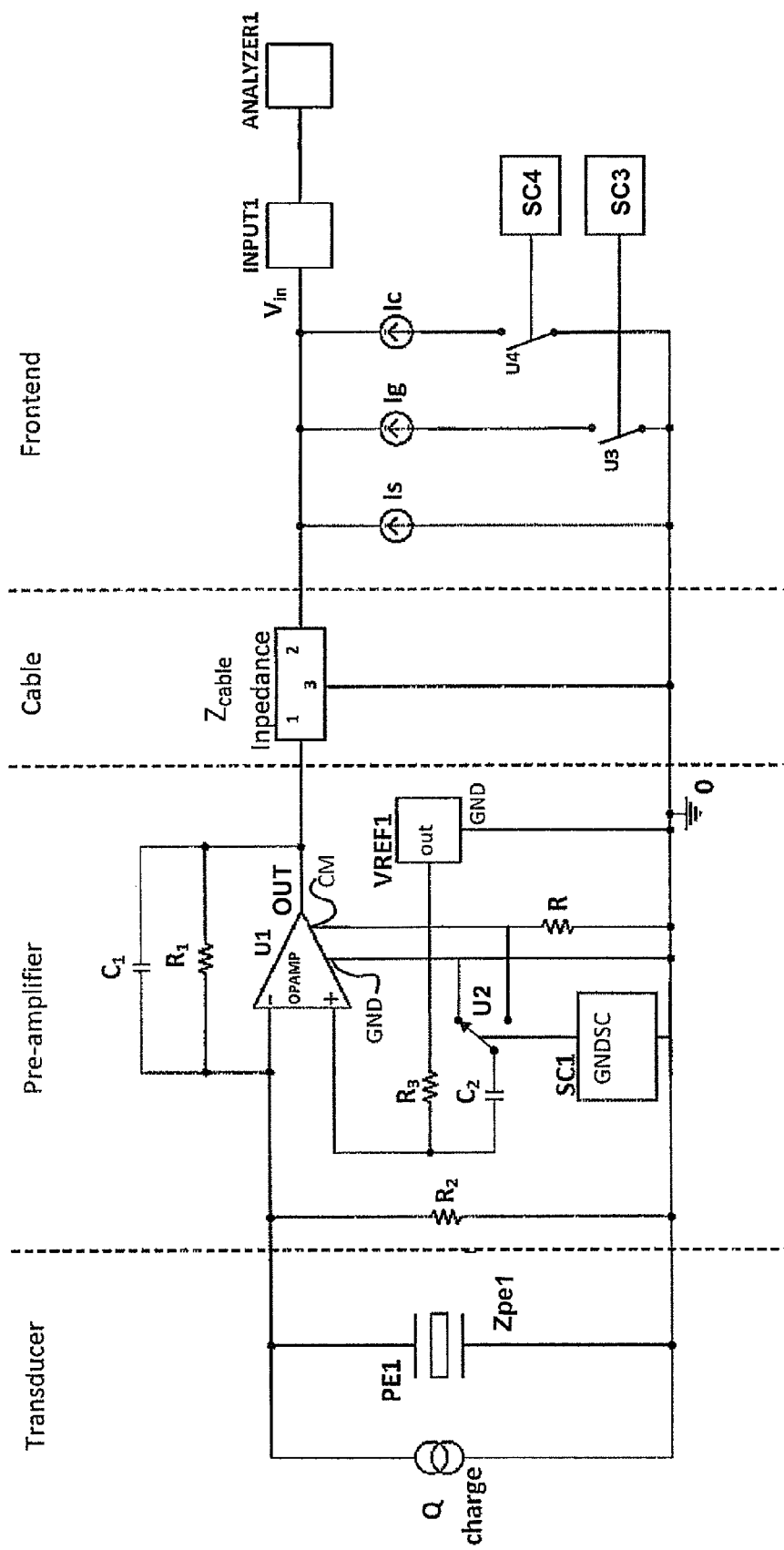
FIG. 1 is a schematic representation of a two-wire charge coupled apparatus comprising a sensor, a preamplifier, cable impedance, current sources and connection to the input of an analyzer.
Figure 3:
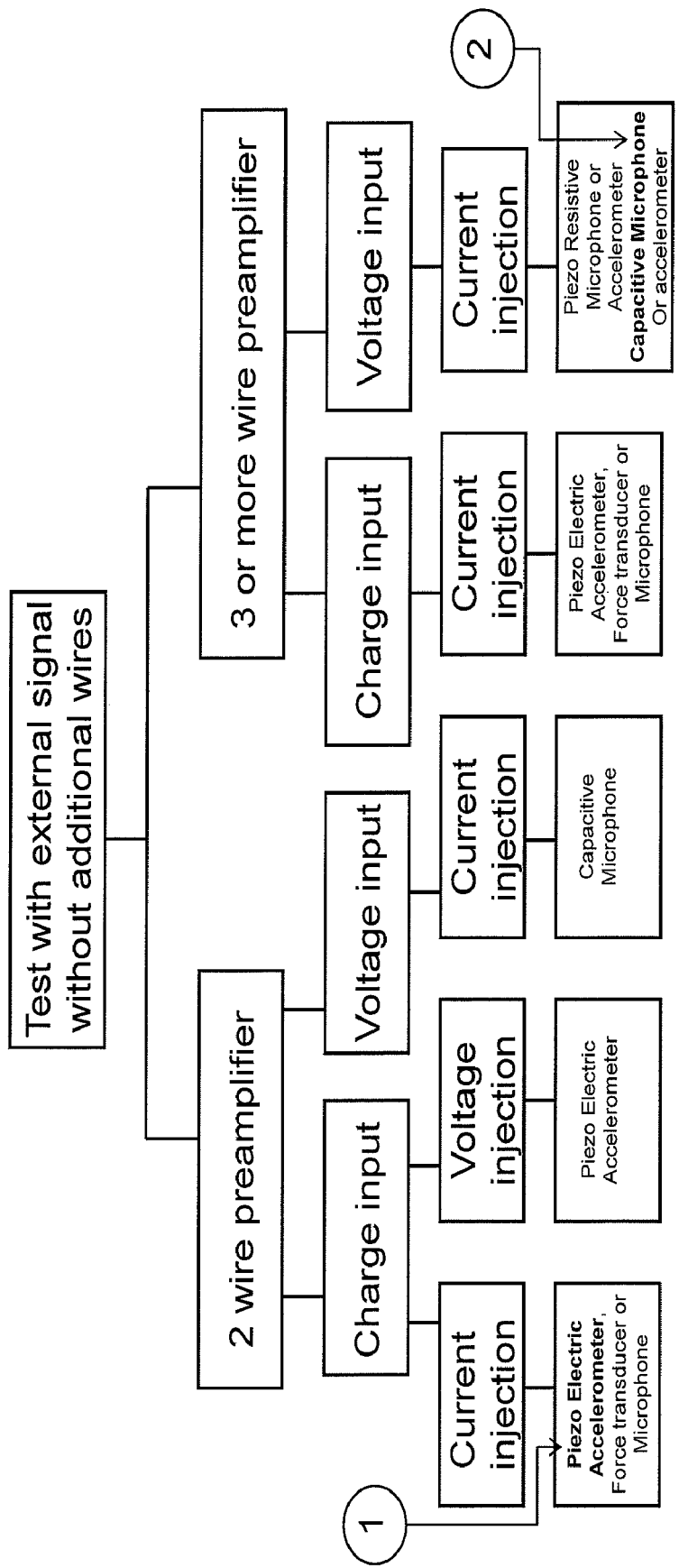
FIG. 3 shows in a schematic form a family of implementations of transducers to be exposed to the present invention, though other implementations might be applicable. Item 1 and 2 correspond to the two embodiments described in detail.

Schematically shown in FIG. 1 is a piezo electric transducer which is also schematically shown in FIG. 3 as item 1, where one sample transducer and the additional circuitry necessary to be able to describe this embodiment of the invention are represented. The sensor PE1 is of a piezo-electric type characterised by its charge sensitivity Q and impedance Zpe1. The transducer is operated in charge mode, which is well known to a man skilled in the art. The sensor PE1 is coupled to the inverting input of an operational amplifier U1 with feedback capacitor C1. A biasing voltage VREF1 is through resistor R3 fed to the non-inverting input of the amplifier U1. This, as such, constitutes a basic charge coupled transducer. It is well known in this field, that power supply to the amplifier can be a constant current originating from the current generator circuit Is. In this way the signals from sensor PE1 are amplified by the amplifier U1 and are present on the output terminal OUT thereof as a voltage superposed on the voltage originating from the current feed Is. The present embodiment is characterised as a two-wire charge constant current line drive type of transducer with a piezo-electric accelerometer as the sensing element also shown in the structure diagram in FIG. 3 as item 1. The transfer function is:

$$\frac{Vin(\omega)}{Q} = \frac{1}{C1\left(1 + \frac{1}{j \cdot \omega \cdot R1 \cdot C1}\right) \cdot (1 + j \cdot \omega \cdot Rc \cdot Cc)}$$

Q is charge sensitivity in C/Unit,
Rc is cable series resistor,
Cc is Cable capacitance,
Vin voltage at INPUT1 equals output of the transducer through the cable impedance, and
$\omega = 2 \cdot \pi \cdot$ frequency.

The current Is flowing into terminal OUT on amplifier U1 supplying power to amplifier U1, and a residual current is also running through a current measuring circuit R and is derived as a proportional voltage on output ground (or common mode) terminal CM of amplifier U1. When a current test signal Ig is supplied from a generator and superposed on the supply current Is via operation of switch U3 and its associated switch control SC3, said current measuring circuit R derives this as a superposed voltage on terminal CM. When switch U2 is in the shown position and connects the coupling capacitor C2 to input ground GND via operation of switch U2 and ground switch control SC1, the transducer operates in normal mode. When switch U2 is in the alternate test mode position, the voltage derived from the superposed currents Is and Ig are connected through coupling capacitor C2 to the non-inverting input of the amplifier U1. Since the coupling capacitor C2 will filter off direct current components, only alternating current signals will reach the non-inverting input on the amplifier U1. The transfer function for this mode is:

$$\frac{Vin(\omega)}{Ig} = \left[1 + \frac{1}{Zp \cdot j \cdot \omega \cdot C1\left(1 + \frac{1}{j \cdot \omega \cdot R1 \cdot C1}\right)}\right] \cdot \frac{R}{\left(1 + \frac{1}{j \cdot \omega \cdot R3 \cdot C2}\right) \cdot (1 + j \cdot \omega \cdot Rc \cdot Cc)^2}$$

where impedance of the piezo-electric sensor is Zp=Zpe1∥R2. It is seen that the transfer function is dependent on impedance Zp. In case of the transducer being a piezo-electric accelerometer, it is characterized by having a resonant frequency.

In order to obtain sufficient measuring accuracy by means of this type of transducer it is necessary to mount the accelerometer on a plane and clean surface and the securing moment of force for screw connections must be suitable. When the securing moment of force is reduced, the resonant frequency drops until no connection exists and the resonant frequency is now the free resonant frequency. When the resonant frequency is very close to the indication of the calibration chart, it means that the accelerometer is sufficiently well mounted. Since impedance Zpe1 depends on the resonance frequency, the resonance frequency can be measured by injection of a test signal Ig as indicated above. By this method, accelerometer impedance (capacitance, resonance and coupling parameters), total amplification, low frequency cut-off and cable impedance can be measured. Detection is based either on a 1-channel analyzer, which analyses the transducer response, or a 2-channel analyzer, where the transfer function between the test signal Ig and the transducer response is calculated. The advantage using a 2-channel analysis is better signal to noise ratio, phase information and rejection of vibration signals.

Figure 2:
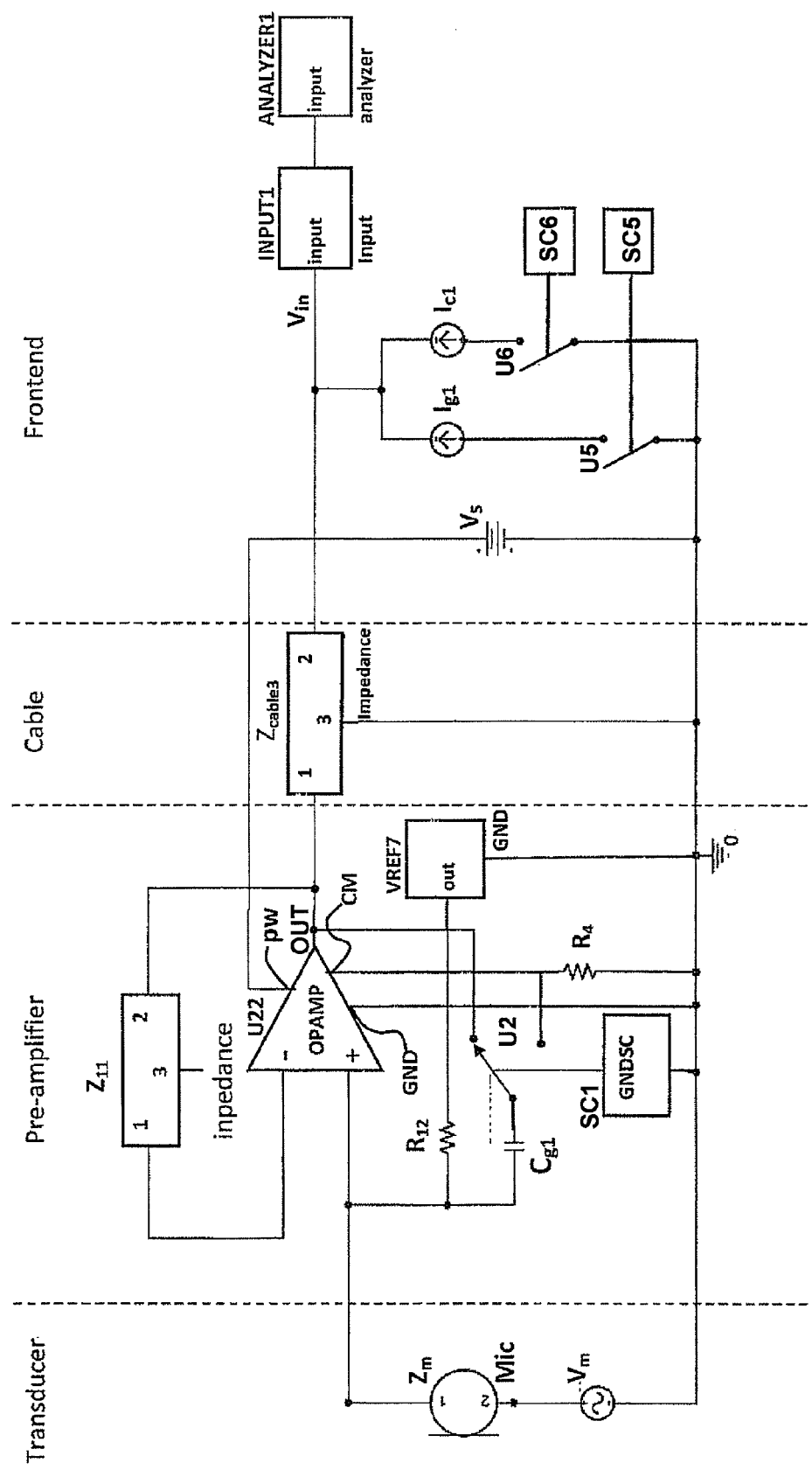
FIG. 2 is a schematic representation of a three-wire voltage coupled apparatus comprising a sensor, a preamplifier, cable impedance, constant voltage supply, current sources and connection to the input of an analyzer.

Another embodiment is shown in FIG. 2 and utilizes Item 2 of FIG. 3. FIG. 2 shows one sample transducer and the additional circuitry necessary in order to describe this embodiment of the invention. The sensor MIC is a condenser microphone characterised by its voltage sensitivity Vm and the impedance Zm. The transducer is operated in voltage mode, which is well known to a man skilled in the art. In this embodiment, the microphone is coupled to the non-inverting input of an operational amplifier U22 in unity gain mode characterised by feedback impedance Z11. A biasing voltage VREF7 is through resistor R12 fed to the non-inverting input of the amplifier U22. Supply power Vs to the preamplifier in this embodiment is fed to a power supply pin pw on amplifier U22. This as such constitutes a basic voltage coupled unity gain transducer operating in a three-wire transducer circuit. Amplifier U22 is operated as a current line drive amplifier where the signals from sensor MIC are amplified by the amplifier U22 and are present on the output as current. The transfer function is:

$$\frac{Vin(\omega)}{Vm} = \frac{1}{\left(1 + \frac{Zm}{R12}\right) \cdot (1 + j \cdot \omega \cdot Rc \cdot Cc)}$$

Vm is voltage sensitivity in V/Unit,
Vin voltage at INPUT7,
Rc is cable serial resistor,
Cc is Cable capacitance,
Zm is microphone impedance, and
$\omega = 2 \cdot \pi \cdot$ frequency.

In FIG. 2 there is also shown resistor R4 connected between terminal CM on amplifier U22 and the ground, and capacitor Cg1 that through switch U2 and its switch control GNDSC can be connected to either the output terminal OUT on amplifier U22 or terminal CM on amplifier U22. Since the amplifier U22 operates in current line drive mode, a current Ig1 by use of switch U5 and its switch control SC5 can be superposed on the signal current in the output terminal OUT. Terminal CM on the amplifier U22 constitutes an output through a current measuring circuit R4 deriving a voltage in proportion to the current in the output terminal. In this embodiment, the shown capacitor Cg1 constitutes a physical capacitor in the microphone construction acting as input capacitance compensation, and referred to as guard capacitor.

When switch U2 connects the capacitor Cg1 to terminal OUT on amplifier U22, the transducer operates in normal mode. When switch U2 is in the alternate test mode position, the voltage derived from the superposed current of voltage Vs and Ig1 is connected through guard capacitor Cg1 to the non-inverting input terminal of the amplifier U22, filtering direct current components and only passing alternating current signal to the non-inverting input terminal of amplifier U22. The transfer function for this mode is:

$$\frac{Vin(\omega)}{Ig} = \frac{R \cdot Zm1}{\left(Zm1 + \frac{1}{j \cdot \omega \cdot Cg}\right) \cdot (1 + j \cdot \omega \cdot Rc \cdot Cc)^2}$$

where Zm1=Zm||Z12.

It is seen that the transfer function is dependent on impedance Zm. By this method, microphone impedance (capacitance and resonance), total amplification, low frequency cut-off and cable impedance can be measured. Detection is based on either a 1-channel analyzer, which analyses the transducer response, or a 2-channel analyzer, where the transfer function between the test signal and the transducer response is calculated. The advantage of using a 2-channel analysis is better signal to noise ratio, phase information and rejection of acoustic signals.

Since the present invention relies on a change of the switch U2 between normal operation and test mode, and it is asserted to be achieved without additional wiring, the present invention—in addition to conditioning amplifiers and switching circuitry according to the description—comprises a mode control system for decoding of a mode control signal to be superposed on the output line. In FIG. 1 and FIG. 2, a mode control current generator Ic and Ic1 are respectively shown, which are respectively operated by respective switch U4 and switch control SC4 or switch U6 and switch control SC6. This current generator Ic or Ic1 is controlled from the test generator circuit and is dependent on timing of the change in currents from current generator Ic or Ic1, while a decoding circuit in the preamplifier switch control GNDSC will signal U2 to change between normal operation and test mode.

Figure 4:
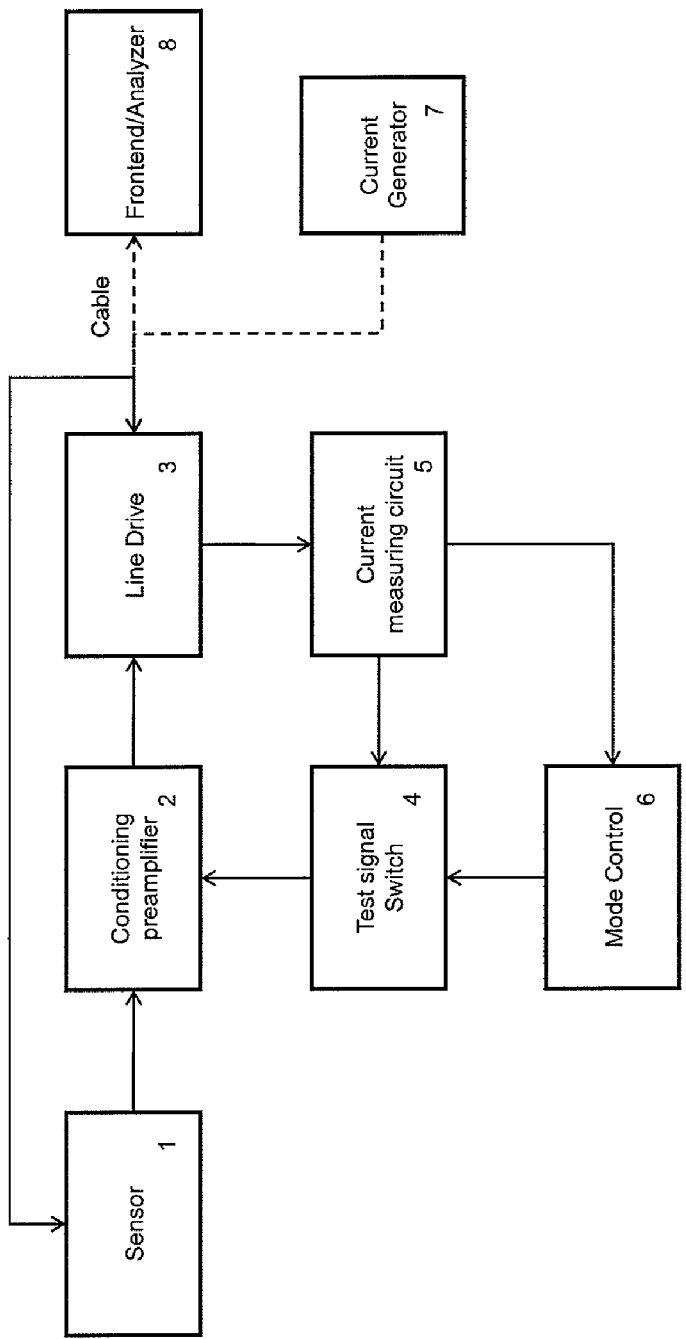
FIG. 4 is a functional view of the invention, where the basic elements and their interconnections of the invention are shown.

FIG. 4 is a schematic diagram outlining the functional elements of the invention and their interconnections. The sensor 1 is connected to the conditioning preamplifier 2. The amplifier 2 is connected to the line drive 3 and the cabling to the remote measuring equipment frontend/analyzer 8. A current generator 7 can be connected to the output of the line drive 3, where a current measuring circuit 5 monitors the current in the output of the line drive 3. The injected current from the current generator 7 is derived in a test signal wired to the test signal switch 4 and a test control signal wired to mode control 6 which in turn controls the test signal switch 4 injecting the derived signal into conditioning preamplifier 2.

The invention claimed is:

1. A method for testing of a transducer, which transducer includes a sensing element having an impedance and an associated conditioning preamplifier, said method comprising the steps of:
    providing a test signal for introduction into an input terminal of the preamplifier when testing is desired,
    providing a mode control signal when testing is desired, wherein the test signal is concomitant the mode control signal so that the mode control signal is superposed on the input terminal as well, and so that together the test signal and mode control signal constitute test signalling,
    decoding of said mode control signal in a local circuit in said preamplifier which indicates that testing is desired,
    enabling, based on the decoding of the mode control signal, a routing of said test signal into said input terminal of said preamplifier, and
    analyzing, when the test signal is selectively routed to the input terminal, an output of the preamplifier indicative of the impedance of the sensor tested to determine electrical properties of said transducer from a remote location.

2. A method for testing of a transducer according to claim 1, wherein said test signalling is introduced through and superposed on an output terminal of said transducer.

3. A method for testing of a transducer according to claim 1, wherein said test signalling is introduced remotely from a central generator.

4. A method for testing of a transducer according to claim 1, wherein said test signal is routed to the non-inverting input of said preamplifier.

5. A transducer apparatus comprising:
    a sensor having an impedance;
    a matching conditioning preamplifier for said sensor,
    a power supply which supplies a power signal to an input terminal of said preamplifier during a normal operation of said preamplifier;
    a test signal generator which generates a test signal which is selectively supplied to the input terminal of said preamplifier;
    a mode control signal generator which generates a mode control signal, wherein said test signal is concomitant to the mode control signal, and which mode control signal is superposed on the input terminal as well so that together the test signal and mode control signal constitute test signalling;
    a decoder in a local circuit of said preamplifier which decodes said mode control signal;
    a switch which is actuated by said decoded mode control signal to a test mode to supply the test signal to the input terminal of said preamplifier;
    an analyzer which, when the test signal is supplied to the input terminal, analyzes an output signal of the preamplifier indicative of the impedance of the sensor tested to determine electrical properties of said transducer from a remote location.

6. A transducer apparatus according to claim 5, wherein the power supply for said preamplifier is a constant current supply, and wherein the output signal of said preamplifier is superposed on said constant current power supply.

7. A transducer apparatus according to claim 5, wherein the power supply for said preamplifier is a constant voltage supply, and wherein said output signal is input separately from said constant voltage power supply.

8. A transducer apparatus according to claim 5, wherein said test signalling originates from a remote central test generator.

9. An transducer apparatus according to claim 5, wherein said test signal is superposed on said output signal.

* * * * *